(12) United States Patent
Hirano et al.

(10) Patent No.: US 6,232,846 B1
(45) Date of Patent: May 15, 2001

(54) OSCILLATOR MODULE AND COMMUNICATIONS DEVICE USING THE SAME

(75) Inventors: Yasuhiko Hirano, Ishikawa-ken; Tsutomu Ieki, Kyoto; Hiroaki Tanaka, Osaka-fu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/329,825

(22) Filed: Jun. 10, 1999

(30) Foreign Application Priority Data

Jun. 12, 1998 (JP) .................................................. 10-165169

(51) Int. Cl.[7] ............................... H03B 5/30; H03B 5/31; H03L 1/00
(52) U.S. Cl. ...................... 331/107 A; 331/68; 331/154; 331/175
(58) Field of Search .................................. 331/44, 68, 96, 331/107 A, 154, 175

(56) References Cited

U.S. PATENT DOCUMENTS 4,361,026 * 11/1982 Muller et al. ............................ 73/23
5,029,267 * 7/1991 Masuda et al. ................... 331/107 A

FOREIGN PATENT DOCUMENTS

| 0386498 | 9/1990 | (EP) . |
| 59-149406 | 8/1984 | (JP) . |
| 10013155 | 1/1998 | (JP) . |

* cited by examiner

*Primary Examiner*—David Mis
(74) *Attorney, Agent, or Firm*—Ostrolenk, Faber, Gerb & Soffen, LLP

(57) ABSTRACT

An oscillator module in which external wires can be reduced, and characteristics of a resonator and oscillation margin can be measured. A circuit portion for oscillation and a two-port surface acoustic wave resonator are sealed in a package, one of the terminals of the two-port surface acoustic wave resonator is connected inside the package to an input terminal of the circuit portion for oscillation. The number of external terminals provided at the package is reduced, enabling the oscillator module to be made small-scale and at lower cost. Furthermore, it is possible to measure the insertion loss and resonant frequency of the two-port surface acoustic wave resonator, and the oscillation margin of the oscillator module, making it possible to improve the yield of the oscillator and reduce costs.

20 Claims, 7 Drawing Sheets

OSCILLATOR MODULE AND COMMUNICATIONS DEVICE USING THE SAME

BACKGROUND OF THE INVENTION

1. Field of the Invention

The present invention relates to an oscillator module and a communications device using the same and, more particularly, to an oscillator module used in an ultra-low power or low-power radio device, and a communications device using the same.

2. Description of the Related Art

Recently, there has been an increase in the use of communications devices using ultra-low power or low-power and remote control systems, such as in keyless entry. An oscillator module which maintains stable and high-precision oscillation over a long period of time is used as a signal source in these systems.

FIG. 7 shows a block diagram of a conventional oscillator module. An oscillator module 1 comprises a resonator 2 and a circuit for oscillation 3, which are connected together in a loop and hermetically sealed in a package 4. The package 4 is provided with external terminals 5 and 6 for power input and signal output, and these are connected to the circuit for oscillation 3. The oscillator module 1 functions as a signal source.

Furthermore, FIG. 8 shows a block diagram of another conventional oscillator module, disclosed in Japanese Unexamined Patent Publication No. 9-162643. In FIG. 8, identical or similar members to those of FIG. 7 are designated by the same reference numerals, and a detailed explanation of these members are omitted.

In the oscillator module 10 shown in FIG. 8, the resonator 2 and the circuit for oscillation 3 are not connected to one another inside the package 4. Instead, the resonator 2 is connected to external terminals 11 and 12, provided at the package 4, and the circuit for oscillation 3 is connected to external terminals 5 and 6, also provided at the package 4.

In the oscillator module 10, the resonator 2 and the circuit for oscillation 3 are independent of each other (i.e., they are separately arranged), and it is possible to measure their characteristics while they are sealed in the package 4. However, the module cannot function as an oscillator in this state. Therefore, the external terminals 11 and 12 are connected outside the package 4 to the external terminals 5 and 6, respectively, by external other wires 13 and 14. Thus, whereby the resonator 2 and the circuit for oscillation 3 form an oscillator loop and the oscillator module 10 functions as a signal source in the same way as the oscillator module 1.

There are cases where the characteristics of an oscillator module change when it is hermetically sealed in a package.

However, in the oscillator module 1, although it is possible to measure the oscillation characteristics after sealing it in the package 4, it is not possible to measure the oscillation margin, since this requires a measuring device to be individually connected to both the resonator 2 and the circuit for oscillation 3, which form the oscillator, and also between the resonator 2 and the circuit for oscillation 3 (at a point in the oscillator loop). Consequently, when the conditions under which the oscillator module 1 oscillates cannot be detected in advance (even when such conditions are very strict). When the oscillator module 1 is incorporated in an electronic device, there is a possibility of malfunction, such as the oscillator ceasing oscillation after being combined with other components.

In the oscillator module 10, the resonator 2 and the circuit for oscillation 3 are independent from each other (i.e., not connected within the package 4) and, therefore, it is possible to measure the resonator 2 and the circuit for oscillation 3 individually. It is also possible to measure the oscillation margin using other connection wires. However, since the resonator 2 and the circuit for oscillation 3 are provided independently, there is a problem in that the number of external wires is increased, making the package larger by a proportionate amount and increasing the cost of the package. There is a further problem in that the increased number of external wires prevents the oscillator from being made small-scale. Moreover, there is a problem in that the external wires act as part of a phase circuit of the oscillation loop, and variation in the lengths of the multiple external wires increases complexity, resulting in loss of stability of the oscillation frequency.

SUMMARY OF THE INVENTION

Accordingly, it is an object of the present invention to provide an oscillator module in which external wires can be reduced, and the characteristics of the resonator and the oscillation margin can be easily measured.

In order to solve the above problems, the oscillator module of the present invention comprises a circuit portion for oscillation; a two-port surface acoustic wave resonator, its two ports each comprising two terminals; a package for sealing the circuit portion for oscillation and the two-port surface acoustic wave resonator; a first external terminal connected to the circuit portion for oscillation, and a second external terminal connected to a terminal of the two-port surface acoustic wave resonator, the first and second external terminals being provided at the package; the remaining terminals of the two-port surface acoustic wave resonator being connected to the circuit portion for oscillation within the package.

Furthermore, in the oscillator module of the present invention, one of the terminals of the two-port surface acoustic wave resonator is connected to an input terminal of the circuit portion for oscillation inside the package.

Furthermore, in the oscillator module of the present invention, the circuit portion for oscillation comprises a bare-chip IC, the two-port surface acoustic wave resonator comprises a bare-chip IC, and the circuit portion for oscillation and the two-port surface acoustic wave resonator are bare-chip-mounted on the package.

Furthermore, a communications device of the present invention comprises the oscillator module described above.

Thus, the oscillator module of the present invention reduces the number of external terminals provided to the package, and enables costs to be lowered. Furthermore, it is possible to measure the oscillation margin of the resonator and the entire oscillator module.

Furthermore, the communications device of the present invention can be made at low cost.

DESCRIPTION OF THE PREFERRED EMBODIMENT

Figure 1:
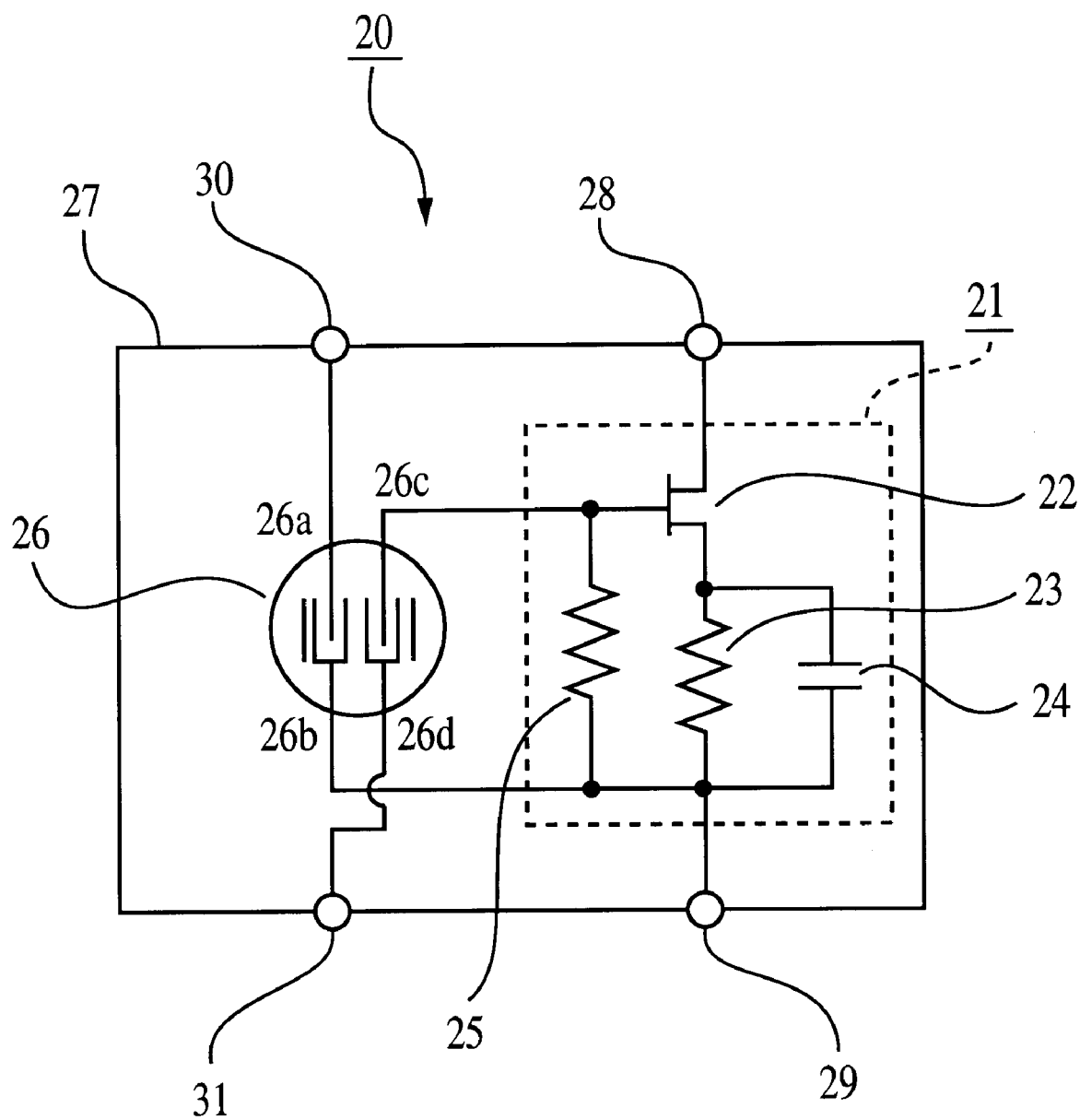
FIG. 1 is a circuit diagram showing an embodiment of an oscillator module of the present invention.

FIG. 1 shows an embodiment of the oscillator module of the present invention.

In FIG. 1, an oscillator module 20 comprises a circuit portion for oscillation 21 and a two-port surface acoustic wave resonator 26, these being hermetically sealed in a package 27. First external terminals 28 and 29 and second external terminals 30 and 31 are provided at the package 27.

The circuit portion for oscillation 21 comprises a FET 22, resistors 23 and 25, and a capacitor 24. The drain of the FET 22 is connected to the first external terminal 28. The source of the FET 22 is connected via the resistor 23 to the first external terminal 29, and the capacitor 24 is connected in parallel with the resistor 23. Furthermore, the resistor 25 is connected between the gate of the FET 22 and the first external terminal 29. As a result, the circuit portion for oscillation 21 comprises an amplifier having the gate of the FET 22 as its input terminal and the drain as its output terminal.

Furthermore, the two-port surface acoustic wave resonator 26 has two terminals 26a and 26b, used as ports for input, and two terminals 26c and 26d, used as ports for output. The terminal 26a of the two-port surface acoustic wave resonator 26 is connected to one of the second external terminals, 30, and the terminal 26d is connected to the other second external terminal 31.

The terminal 26c of the two-port surface acoustic wave resonator 26 is connected within the package 27 to the gate of the FET 22, that is, to the input terminal of the circuit portion for oscillation 21. Furthermore, the terminal 26b of the two-port surface acoustic wave resonator 26 is connected to the first external terminal 29.

Figure 2:
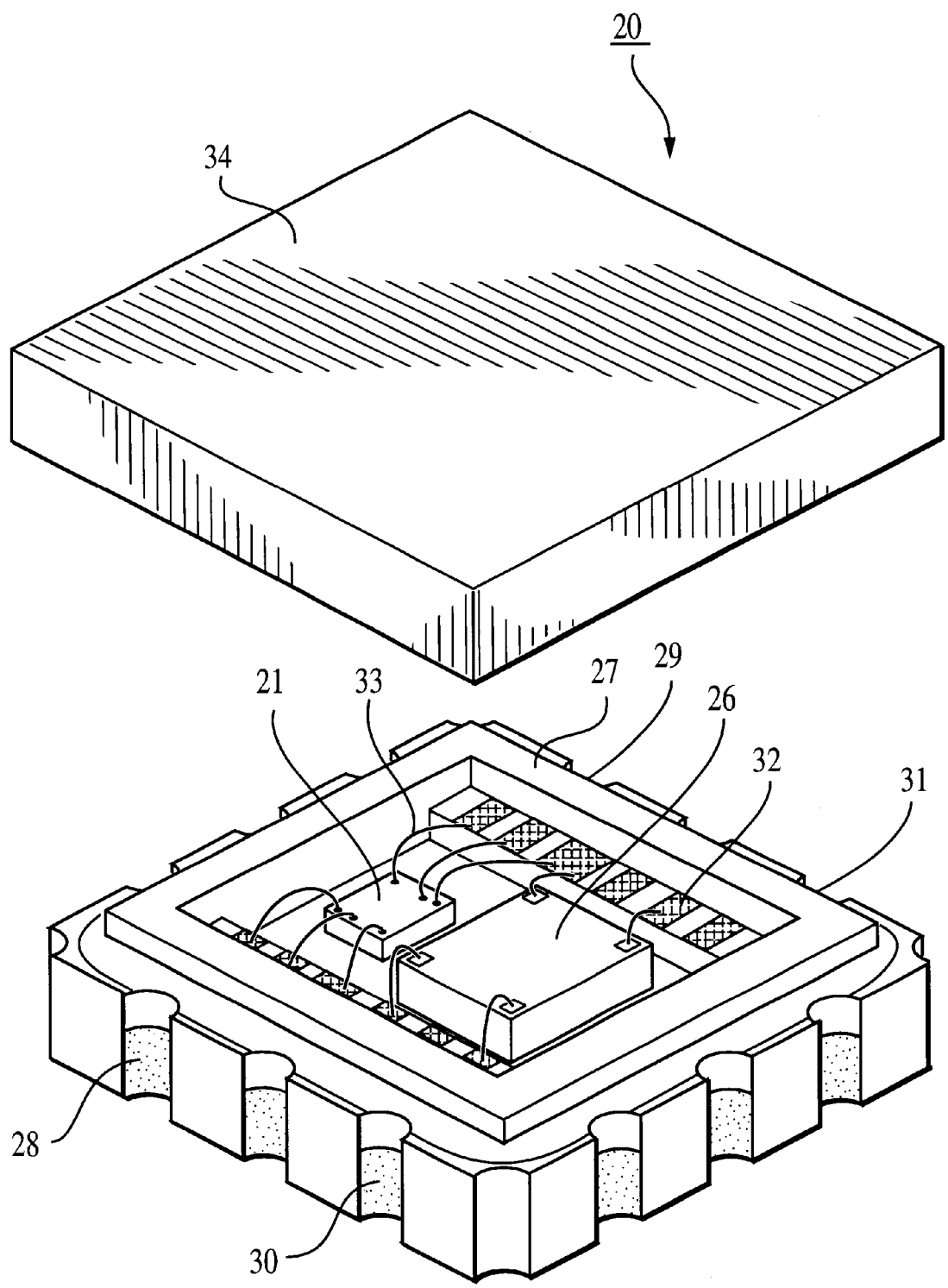
FIG. 2 is an exploded perspective view of the oscillator module of FIG. 1.

FIG. 2 shows a perspective view of the oscillator module 20 shown in FIG. 1. In FIG. 2, the oscillator module 20 comprises (i) a circuit portion for oscillation 21, implemented as a bare-chip integrated circuit, and (ii) a bare-chip two-port surface acoustic wave resonator 26, these being mounted in a concave component mount portion provided at substantially the center of a substrate-like package 27. First external terminals 28 and 29 and second external terminals 30 and 31 are provided on side faces of the package 27. The circuit portion for oscillation 21 and the two-port surface acoustic wave resonator 26 are connected by wires 33 and internal electrodes 32, inside the package 27. The internal electrodes 32 are connected to the first external terminals 28 and 29 and the second external terminals 30 and 31. A cover 34 is attached over the package 27 and completely covers the circuit portion for oscillation 21, the two-port surface acoustic wave resonator 26, the internal electrodes 32 and the wires 33.

Figure 3:
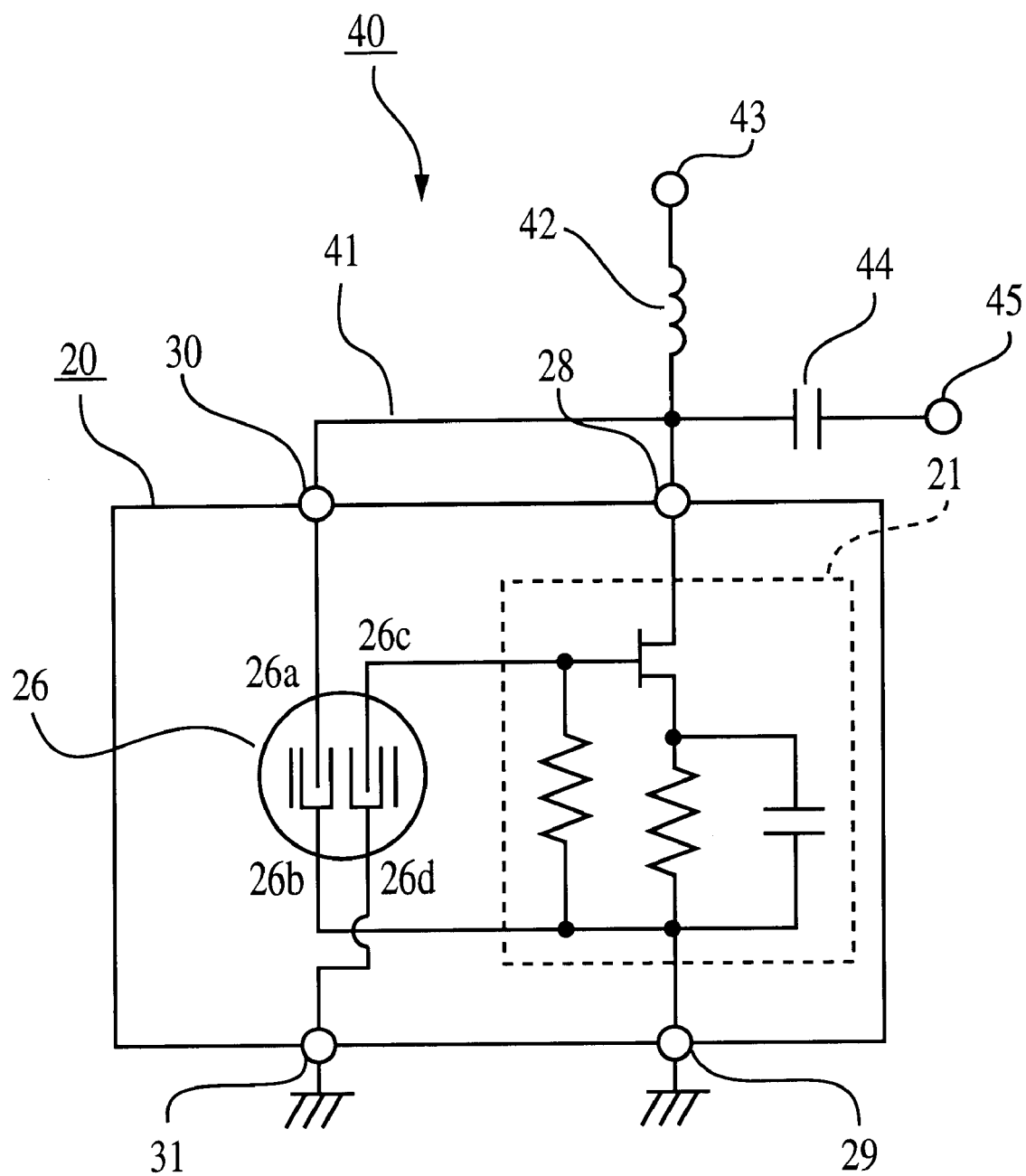
FIG. 3 is a circuit diagram showing an embodiment of an oscillator using the oscillator module of FIG. 1.

FIG. 3 shows an embodiment of an oscillator utilizing the oscillator module 20. In the oscillator module 40 shown in FIG. 3, the first external terminal 29 and the second external terminal 31 of the oscillator module 20 are grounded. Further, the first external terminal 28 and the second external terminal 30 are connected by an external wire 41. The first external terminal 28 is connected, via an inductor 42, to a power supply terminal 43. The first external terminal 28 is connected, via a capacitor 44, to an output terminal 45. As a result, the two-port surface acoustic wave resonator 26 has the terminal 26a as its input terminal, and the terminal 26c as its output terminal.

In this way, the oscillator module 20 functions as an oscillator by connecting some of the external terminals using external wire. Therefore, the number of external terminals provided to the package can be reduced versus when the resonator and the circuit portion for oscillation are provided completely separately in the package. The oscillator module is, thus, smaller and of lower cost. Furthermore, since there are fewer external wires, the costs of constructing the oscillator can be reduced, and variation in the characteristics (due to the external wires) is likewise reduced.

Figure 4:
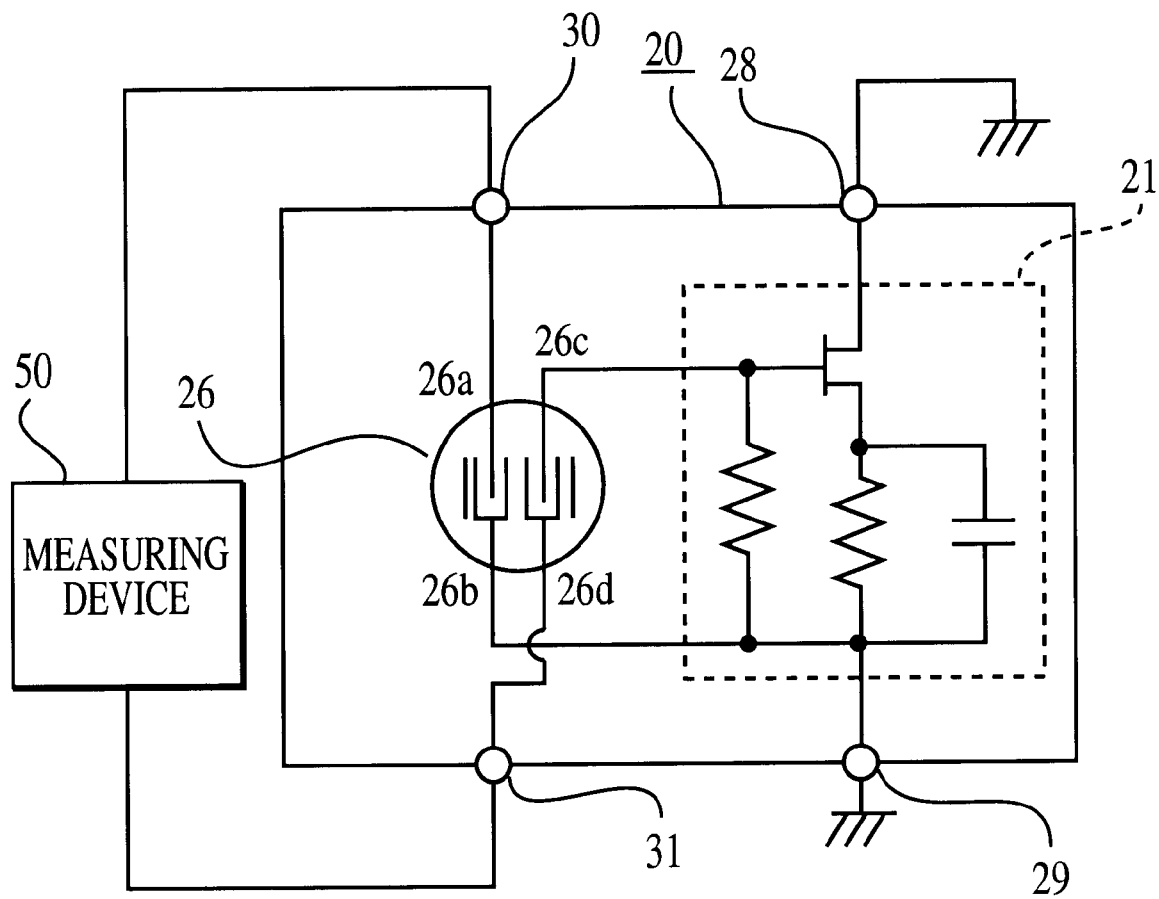
FIG. 4 is a circuit diagram showing a measuring system for measuring resonant frequency and insertion loss of a two-port surface acoustic wave resonator of the oscillator module of FIG. 1.

FIG. 4 shows a measuring system for measuring resonant frequency and insertion loss of the two-port surface acoustic wave resonator 26 in the oscillator module 20 shown in FIG. 1. In FIG. 4, the second external terminals 30 and 31 are connected to a measuring device 50, such as a network analyzer. The first external terminals 28 and 29 are grounded.

In the measuring system of FIG. 4, the measuring device 50 is able to measure the resonant frequency and the insertion loss between the terminal 26a and the terminal 26d of the two-port surface acoustic wave resonator 26. In the oscillator 40 of FIG. 3, the two-port surface acoustic wave resonator 26 used terminal 26a as its input terminal and terminal 26c as its output terminal, and therefore it was necessary to measure the characteristics between terminal 26a and terminal 26c. However, the characteristics between terminal 26a and terminal 26d are merely 180 degrees out of phase with the characteristics between the terminal 26a and the terminal 26c, and consequently there is absolutely no difficulty in measuring the resonant frequency and the insertion loss.

Furthermore, although terminal 26b is directly grounded, terminal 26c is grounded via the circuit portion for oscillation 21, and therefore it cannot be said that the actual characteristics of the two-port surface acoustic wave resonator 26 are being measured. However, even when a slight impedance is inserted between the terminal 26c and ground, the insertion loss and resonant frequency can be measured in almost the same manner as when the terminal 26c is directly grounded, without difficulty.

Figure 5:
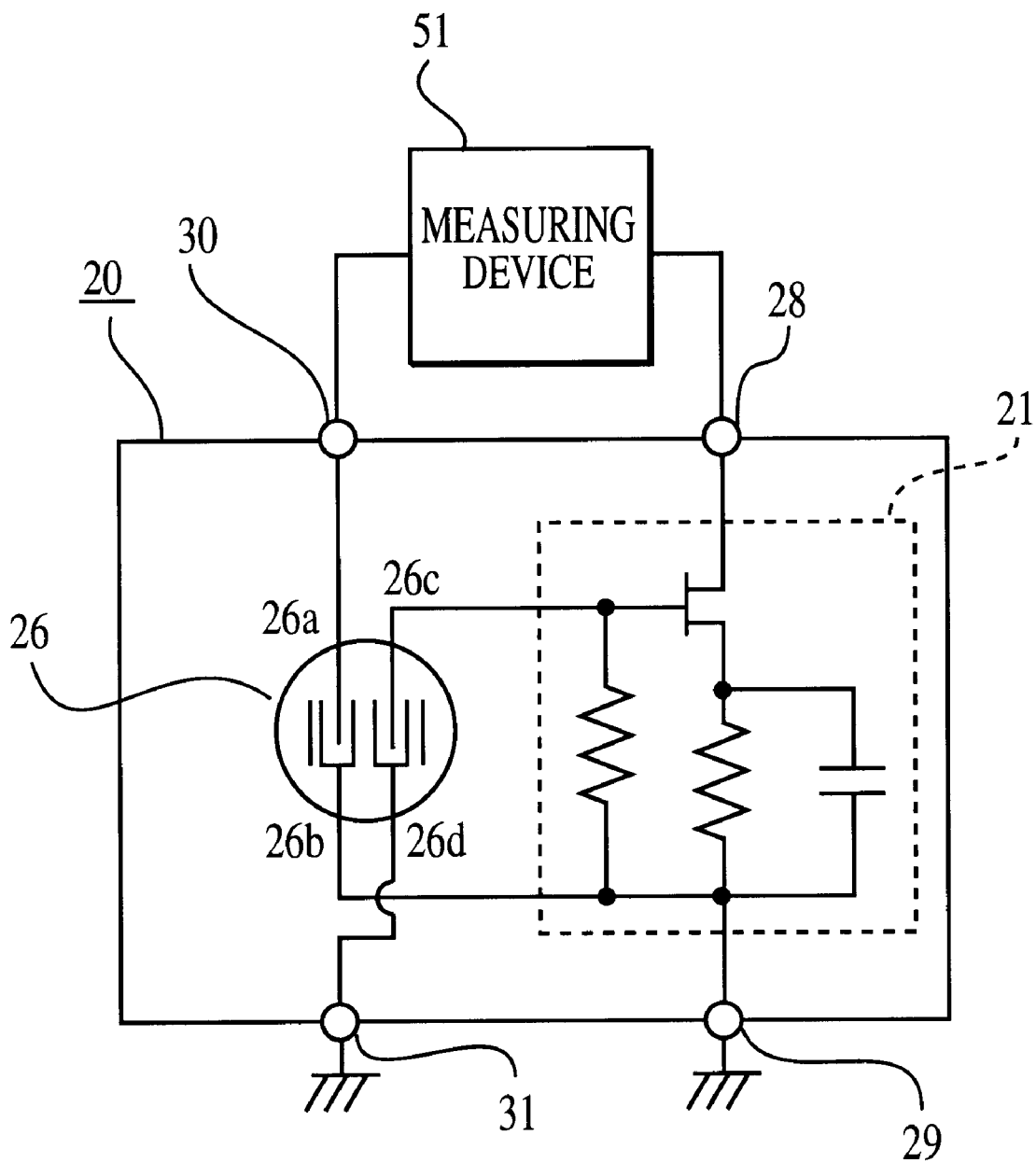
FIG. 5 is a circuit diagram showing a measuring system for measuring the oscillation margin of the oscillator module of FIG. 1.

Furthermore, FIG. 5 shows a measuring system for measuring the oscillation margin of the oscillator module 20 shown in FIG. 1. In FIG. 5, the first external terminal 28 and the second external terminal 30 are connected to a measuring device 51, such as a network analyzer. Furthermore, the first external terminal 29 and the second external terminal 31 are grounded. Direct current or the like is supplied to the circuit portion for oscillation 21 through the measuring device 51.

In the measuring system of FIG. 5, the measuring device 51 is inserted at a position on the external wire 41, which connects the first external terminal 28 and the second external terminal 30 of the oscillator module 20 in the oscillator 40 of FIG. 3. That is, the measuring device 51 is inserted in part of the oscillation loop. In this state, the oscillation margin of the oscillator module 20 can be measured by measuring the transmission characteristics (amplitude and phase) when a signal is input from the second external terminal 30 and a signal is output from the first external terminal 28.

The oscillator 40 can be formed in compliance with the result of the measurements taken using the measuring systems of FIG. 4 and FIG. 5, by adjusting the length of the external wire 41, and inserting a capacitor and inductor for adjusting midway along the external wire 41, so that the oscillator 40 has a large oscillation margin. As a result, it is possible to accommodate changes in characteristics when the oscillator module is hermetically sealed in a package, improving the yield of the oscillator 40 and reducing costs.

Figure 6:
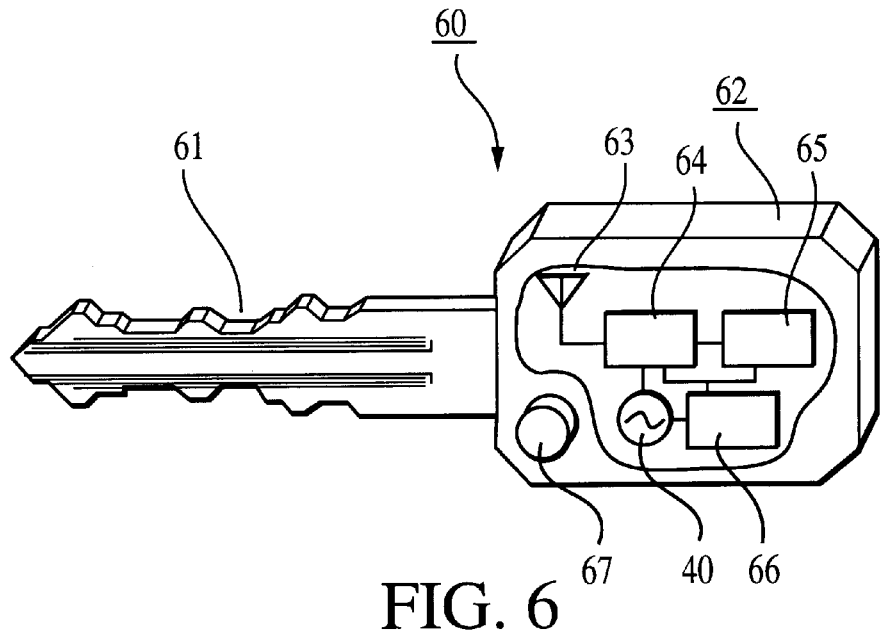
FIG. 6 is a partially broken view of an embodiment of a communications device of the present invention.
Figure 7:
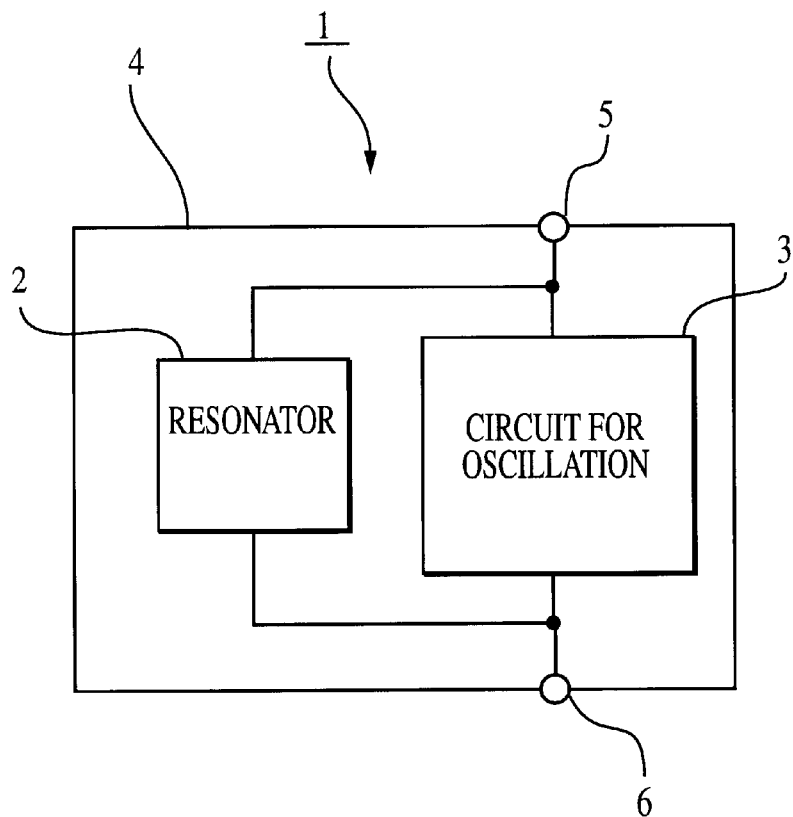
FIG. 7 is a circuit diagram showing a conventional oscillator module.
Figure 8:
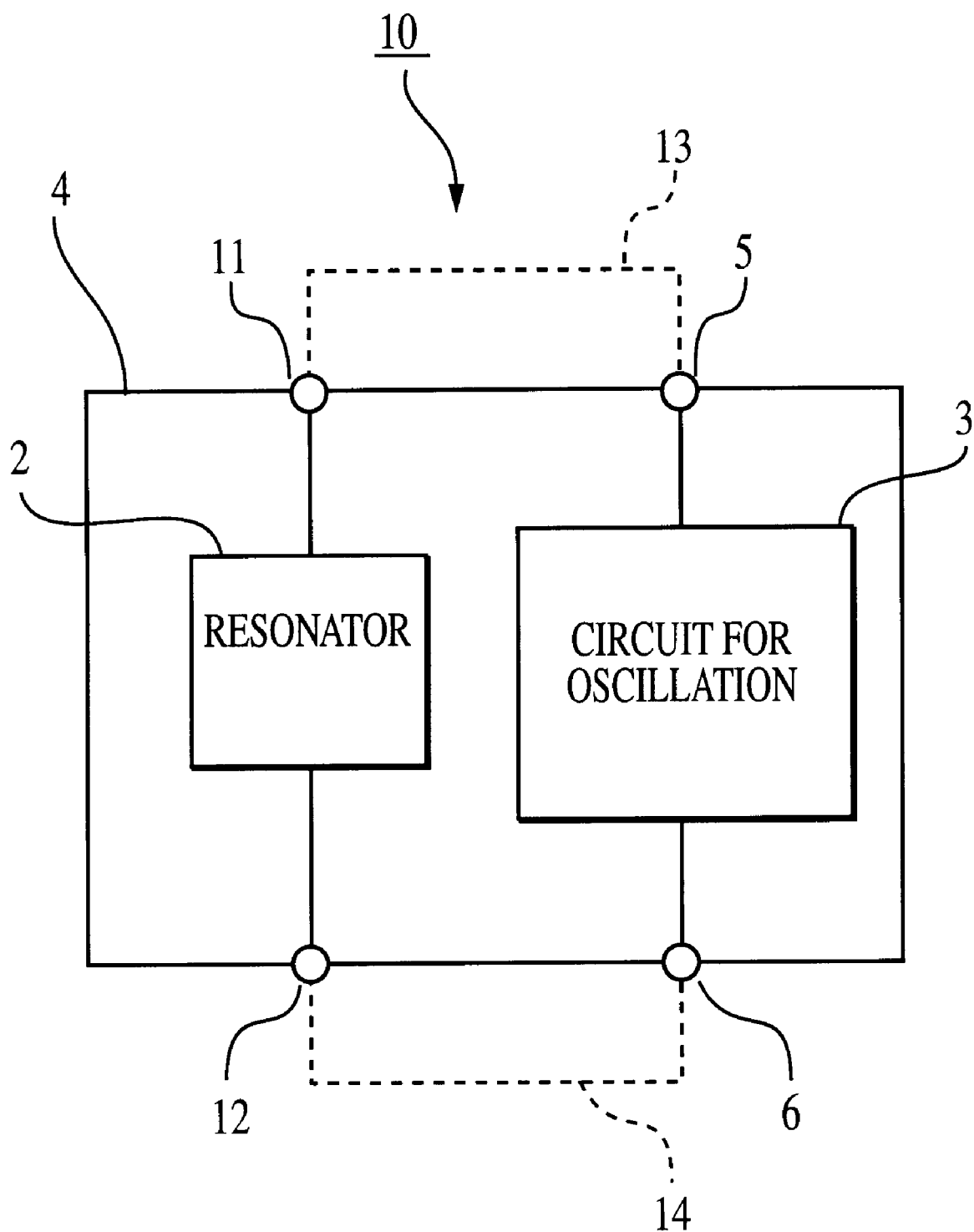
FIG. 8 is a circuit diagram showing another conventional oscillator module.

FIG. 6 shows an embodiment of a communications device of the present invention, being a partially cut away view of a key (single-unit) transmitter for a keyless entry system. The key uses the oscillator 40 shown in FIG. 3. In FIG. 6, the transmitter 60 comprises a key portion 61 and a grip portion 62, which are joined together. The grip portion 62 contains an antenna 63, an oscillator 40, a modulator 64, a code generator 65 and a power supply circuit 66. Furthermore, a switch 67 is provided at the grip portion 62. The code generator 65 is connected, via the modulator 64, to the antenna 63, and the oscillator 40 is connected to the modulator 64. The power supply circuit 66 is connected to the oscillator 40, the modulator 64 and the code generator 65.

When the switch 67 is pressed, the code generator 65 generates a specific digital code corresponding to the particular key. In compliance with the digital code generated by the code generator 65, the modulator 64 modulates an RF signal, input from the oscillator 40. The antenna 63 radiates the modulated RF signal.

Thus, the transmitter for keyless entry system, which uses a communications device having an oscillator module of the present invention, enjoys reduced oscillator variation. Consequently, the yield of the transmitter is improved, and the elimination of adjustment costs enables the device to be made at a low price.

The oscillator module of the present invention comprises a circuit portion for oscillation, a two-port surface acoustic wave resonator, whose two ports each comprise two terminals, a package in which the circuit portion for oscillation and the two-port surface acoustic wave resonator are sealed, a first external terminal, provided at the package and connected to the circuit portion for oscillation, and a second external terminal connected to one of the terminals of the two-port surface acoustic wave resonator, the remaining terminals of the two-port surface acoustic wave resonator being connected to the circuit portion for oscillation inside the package.

Therefore, the number of external terminals provided at the package can be reduced versus when the resonator and the circuit portion for oscillation are provided completely separately inside the package, enabling the oscillator module to be made small-scale and at lower cost. Furthermore, since there are fewer external wires, the costs of manufacturing the oscillator can be reduced. Variation in the characteristics of the oscillator (due to the external wires) is likewise reduced. Furthermore, it is possible to measure the insertion loss and resonant frequency of the two-port surface acoustic wave resonator, and the oscillation margin of the oscillator module. Therefore, by adjusting the external wires accordingly, changes in the characteristics of the circuit portion for oscillation and the two-port surface acoustic wave resonator, which occur when they are hermetically sealed inside the package, can be accommodated, thereby improving the yield of the oscillator and reducing costs.

Furthermore, by using the oscillator module of the present invention in a communications device, the reduced oscillator variation improves the yield of the communications device, and the elimination of adjustment costs enables it to be made at a low price.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An oscillator module, comprising:
   an oscillator circuit;
   a surface acoustic wave resonator having four terminals; and
   a package enclosing said oscillator circuit and said surface acoustic wave resonator, said package having two external oscillator terminals connected to said oscillator circuit, and two external resonator terminals connected respectively to two terminals of said surface acoustic wave resonator,
   wherein the remaining two terminals of said surface acoustic wave resonator are connected to said oscillator circuit inside said package.

2. The oscillator module according to claim 1, wherein an output terminal of said surface acoustic wave resonator is connected to an input terminal of said oscillator circuit inside said package.

3. The oscillator module according to claim 2, wherein said oscillator circuit includes a bare integrated circuit chip mounted within said package and said surface acoustic wave resonator includes a bare integrated circuit chip mounted within said package.

4. The oscillator module according to claim 1, wherein said oscillator circuit includes a bare integrated circuit chip mounted within said package and said surface acoustic wave resonator includes a bare integrated circuit chip mounted within said package.

5. The oscillator module according to claim 1, wherein said two external resonator terminals are connected respectively to an input terminal and an output terminal of said SAW resonator.

6. The oscillator module according to claim 5, wherein an output terminal of said surface acoustic wave resonator is connected to an input terminal of said oscillator circuit inside said package.

7. The oscillator module according to claim 5, wherein an input terminal and an output terminal of said SAW resonator are connected to said oscillator circuit.

8. The oscillator module according to claim 7, wherein an output terminal of said surface acoustic wave resonator is connected to an input terminal of said oscillator circuit inside said package.

9. The oscillator module according to claim 1, wherein an input terminal and an output terminal of said SAW resonator are connected to said oscillator circuit.

10. The oscillator module according to claim 9, wherein an output terminal of said surface acoustic wave resonator is connected to an input terminal of said oscillator circuit inside said package.

11. A communications device, comprising at least one of a transmitting circuit and a receiving circuit, said circuit comprising an oscillator module, said oscillator module including:

an oscillator circuit;

a surface acoustic wave resonator having four terminals; and a package enclosing said oscillator circuit and said surface acoustic wave resonator, said package having two external oscillator terminals connected to said oscillator circuit, and two external resonator terminals connected respectively to two terminals of said surface acoustic wave resonator, wherein the remaining two terminals of said surface acoustic wave resonator are connected to said oscillator circuit inside said package.

12. The communications device according to claim 11, wherein an output terminal of said surface acoustic wave resonator is connected to an input terminal of said oscillator circuit inside said package.

13. The communications device according to claim 12, wherein said oscillator circuit includes a bare integrated circuit chip mounted within said package and said surface acoustic wave resonator includes a bare integrated circuit chip mounted within said package.

14. The communications device according to claim 11, wherein said oscillator circuit includes a bare integrated circuit chip mounted within said package and said surface acoustic wave resonator includes a bare integrated circuit chip mounted within said package.

15. The communications device according to claim 11, wherein said two external resonator terminals are connected respectively to an input terminal and an output terminal of said SAW resonator.

16. The communications device according to claim 15, wherein an output terminal of said surface acoustic wave resonator is connected to an input terminal of said oscillator circuit inside said package.

17. The communications device according to claim 15, wherein an input terminal and an output terminal of said SAW resonator are connected to said oscillator circuit.

18. The communications device according to claim 17, wherein an output terminal of said surface acoustic wave resonator is connected to an input terminal of said oscillator circuit inside said package.

19. The communications device according to claim 11, wherein an input terminal and an output terminal of said SAW resonator are connected to said oscillator circuit.

20. The communications device according to claim 19, wherein an output terminal of said surface acoustic wave resonator is connected to an input terminal of said oscillator circuit inside said package.

* * * * *